(12) United States Patent
Malisic et al.

(10) Patent No.: US 12,203,978 B2
(45) Date of Patent: *Jan. 21, 2025

(54) FLEXIBLE SIDEBAND SUPPORT SYSTEMS AND METHODS

(71) Applicant: Advantest Corporation, Tokyo (JP)

(72) Inventors: Srdjan Malisic, San Jose, CA (US); Chi Yuan, San Jose, CA (US); Seth Craighead, San Jose, CA (US)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/234,281

(22) Filed: Aug. 15, 2023

(65) Prior Publication Data

US 2023/0400505 A1   Dec. 14, 2023

Related U.S. Application Data

(63) Continuation of application No. 17/195,384, filed on Mar. 8, 2021, now Pat. No. 11,733,290.

(Continued)

(51) Int. Cl.
*G01R 31/00* (2006.01)
*G01R 31/28* (2006.01)

(52) U.S. Cl.
CPC ..... *G01R 31/2863* (2013.01); *G01R 31/2817* (2013.01); *G01R 31/2818* (2013.01)

(58) Field of Classification Search
CPC ............ G01R 31/2803; G01R 31/2806; G01R 31/2817; G01R 31/2818; G01R 31/2863; G01R 31/2868; G01R 31/287; G01R 31/2844; G01R 31/2884; G01R 31/2889; G01R 31/31703; G01R 31/3177; G01R 31/31725

See application file for complete search history.

(56) References Cited

U.S. PATENT DOCUMENTS 5,032,789 A  *  7/1991  Firooz ................ G01R 31/2806
                                                       714/724
2003/0172329 A1 * 9/2003  Davis .................. G11C 11/1657
                                                       714/710

(Continued)

FOREIGN PATENT DOCUMENTS

CN          104808170 A       7/2015

*Primary Examiner* — Thang X Le (57) ABSTRACT

Presented embodiments facilitate efficient and effective flexible implementation of different types of testing procedures in a test system. In one embodiment, a flexible sideband support system comprises a load board, testing electronics coupled to the load board, a controller coupled to the testing electronics. The load board is configured to couple with a plurality of devices under test (DUTs), wherein the load board includes in-band testing ports and sideband testing ports. The testing electronics is configured to test the plurality of DUTs, wherein a portion of testing electronics are organized in sideband resource groups. The controller is configured to direct testing of the DUTs, wherein the controller is coupled to the testing electronics and the controller directs selective allocation of the testing electronics in the sideband resource groups to various testing operations of the DUTs. In one exemplary implementation, the controller directs a portion of sideband testing of a plurality of DUTs concurrently.

19 Claims, 7 Drawing Sheets

Related U.S. Application Data

(60) Provisional application No. 63/002,842, filed on Mar. 31, 2020.

(56) References Cited

U.S. PATENT DOCUMENTS

| | | | | |
|---|---|---|---|---|
| 2004/0254779 | A1* | 12/2004 | Wang | G06F 11/261 |
| | | | | 703/27 |
| 2006/0015313 | A1* | 1/2006 | Wang | G06F 30/331 |
| | | | | 703/14 |
| 2008/0010568 | A1* | 1/2008 | Kushnick | H04L 43/50 |
| | | | | 714/724 |
| 2008/0094096 | A1* | 4/2008 | Kishimoto | G01R 31/2894 |
| | | | | 324/759.03 |
| 2008/0229162 | A1* | 9/2008 | Hata | G11C 29/006 |
| | | | | 714/718 |
| 2014/0208177 | A1* | 7/2014 | Parekhji | G01R 31/318572 |
| | | | | 714/729 |
| 2019/0348760 | A1 | 11/2019 | Lee | |
| 2020/0033408 | A1 | 1/2020 | Rogel-Favila et al. | |

* cited by examiner

310
Coupling a plurality of devices under test (DUTs) to testing electronics, wherein the coupling includes in-band testing ports and sideband testing ports.

320
Configuring testing electronics to test the plurality of DUTs, wherein a portion of testing electronics is organized in sideband resource groups.

330
Directing testing including selective allocation of the testing electronics in the sideband resource groups to various testing operations of the DUTs.

FLEXIBLE SIDEBAND SUPPORT SYSTEMS AND METHODS

RELATED APPLICATIONS

This application claims the benefit of and priority to application Ser. No. 17/195,384 entitled Flexible Sideband Support Systems and Methods filed Mar. 8, 2021, and provisional application 63/002,842 entitled Flexible Sideband Support Systems and Methods filed Mar. 31, 2020, which are all incorporated herein by reference.

FIELD OF THE INVENTION

The present invention relates to the field of electronic testing.

BACKGROUND OF THE INVENTION

Electronic systems and devices have made a significant contribution towards the advancement of modern society and have facilitated increased productivity and reduced costs in analyzing and communicating information in a variety of business, science, education, and entertainment applications. Conventional testing systems and methods often have various limitations.

In the past, testers were somewhat constrained with regards to handling different types of protocols for DUT sideband communications. In addition, traditionally there was a fixed relationship of one FPGA testing resource for each DUT. The combination of these conditions or characteristics placed a number of constraints on testing capabilities and effectively prevented parallel sideband testing as a practical matter.

SUMMARY

Presented embodiments facilitate efficient and effective flexible implementation of different types of testing procedures in a test system. In one embodiment, and a flexible sideband support system comprises a load board, testing electronics coupled to the load board, a controller coupled to the testing electronics. The load board is configured to couple with a plurality of devices under test (DUTs), wherein the load board includes in-band testing ports and sideband testing ports. The testing electronics are configured to test the plurality of DUTs, wherein a portion of testing electronics are organized in sideband resource groups. The controller is configured to direct testing of the DUTs, wherein the controller is coupled to the testing electronics and the controller directs selective allocation of the testing electronics in the sideband resource groups to various testing operations of the DUTs. In one exemplary implementation, the controller directs a portion of sideband testing of a plurality of DUTs concurrently.

In one embodiment, the controller includes a flexible firmware configuration that supports multiple protocols associated with sideband test operations. In one exemplary implementation, the multiple resources can be assigned to a specific one of the plurality of DUTs. A sideband resource group can include sideband support for a General Purpose Input/Output (GPIO) protocol, a Universal Asynchronous Receiver-Transmitter (UART), Inter-Integrated Circuit (I2C) protocol, a UART over I2C protocol, Non-Volatile Memory Express-Management Interface (NVME-MI) protocol, a Unique Input/Output (UIO) protocol, an ACT protocol, and Suspend Clock (SUSCLK) protocol.

In one embodiment, a flexible sideband support method comprises: coupling a plurality of devices under test (DUTs) to testing electronics, wherein the coupling includes in-band testing ports and sideband testing ports; configuring testing electronics to test the plurality of DUTs, wherein a portion of the testing electronics is organized in sideband resource groups; and directing testing including selective allocation of the testing electronics in the sideband resource groups to various testing operations of the DUTs. In one exemplary implementation, the directing includes directing a portion of sideband testing of a plurality of DUTs concurrently. Multiple resources can be assigned to a specific one of the plurality of DUTs.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Presented embodiments facilitate convenient and efficient testing of electronic devices. The systems and methods are directed to flexible sideband support systems and methods that facilitate efficient and effective sideband/auxiliary testing support. In one embodiment, flexible sideband support systems and methods include the ability to test sidebands from a large number of devices in a tester simultaneously. In one exemplary implementation, flexible sideband support systems and methods include software and hardware configurations that support flexible sideband configurations.

In one embodiment, flexible sideband support systems and methods include a flexible firmware approach for supporting multiple protocols during sideband/auxiliary test operations. The flexible sideband support systems and methods can enable support for many sideband protocols (e.g., 4., 8., 16., 32., UART, I2C, UART over I2C, GPIO, etc.), even if physically laid out differently with different pin layouts and different physical I/O. Further, the software and hardware are both configurable to handle a variety of load board configurations. In one exemplary implementation, additional FPGA configurations allow the ability to test different DIBs with different pin-outs with different protocols and sidebands. The different protocols and sidebands can be flexibly configurable.

Figure 1:
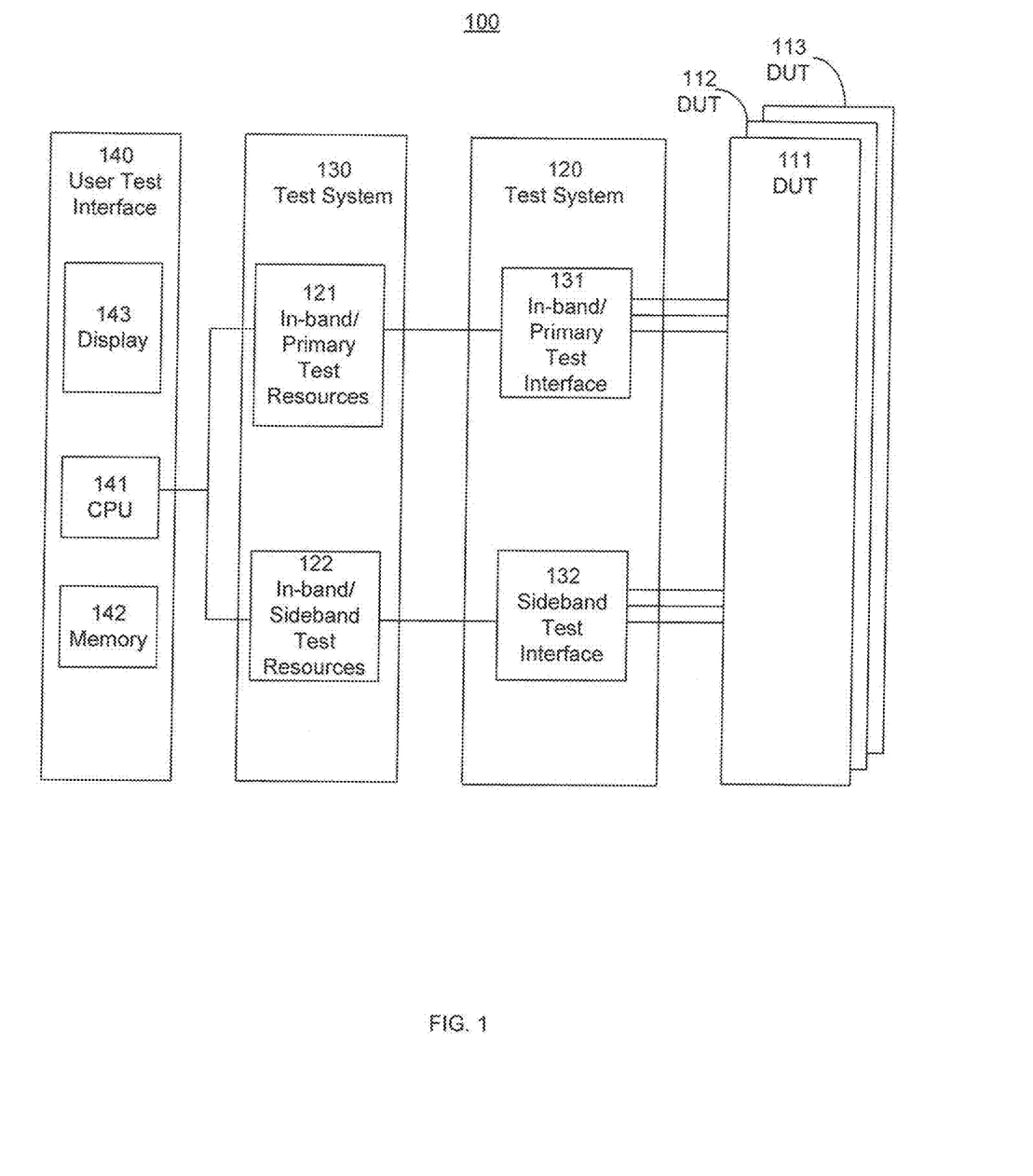
FIG. 1 is a block diagram of an exemplary test environment or system in accordance with one embodiment.

FIG. 1 is a block diagram of an exemplary test environment or system 100 in accordance with one embodiment. The test environment or system 100 includes devices under test (DUT) (e.g., 110, 111, 112, etc.), test or load board 120, test system 130, and user test interface 140. The DUTs (e.g., 110, 111, 112, etc.) are coupled to the test/load board 120 which is coupled to test system 130, which in turn is coupled to the CPU 141. In one embodiment, the test system 130 includes primary or in-band/primary test resources 131 and sideband resources 132, and test/load board 120 includes primary or in-band/primary test interface 121 and sideband interface 122. User test interface 140 includes CPU 141, memory 142, and display 143. In one embodiment, the test system 130 comprises an FPGA. In one embodiment, the FPGA includes in-band/primary test resources 131 (e.g., can include a test signal interface or accelerator, etc.) and sideband interface 132. The FPGA can be configured to perform preliminary analysis and reconfiguration of persistent test information, and also perform preliminary analysis reconfiguration of debug information for communication to an external device. Test/Load board 120 is configured to electrically and physically couple a device under test to the test system. The load board comprises a persistent or in-band test interface 121 and a sideband interface 122 between the device under test and the test system.

Figure 2:
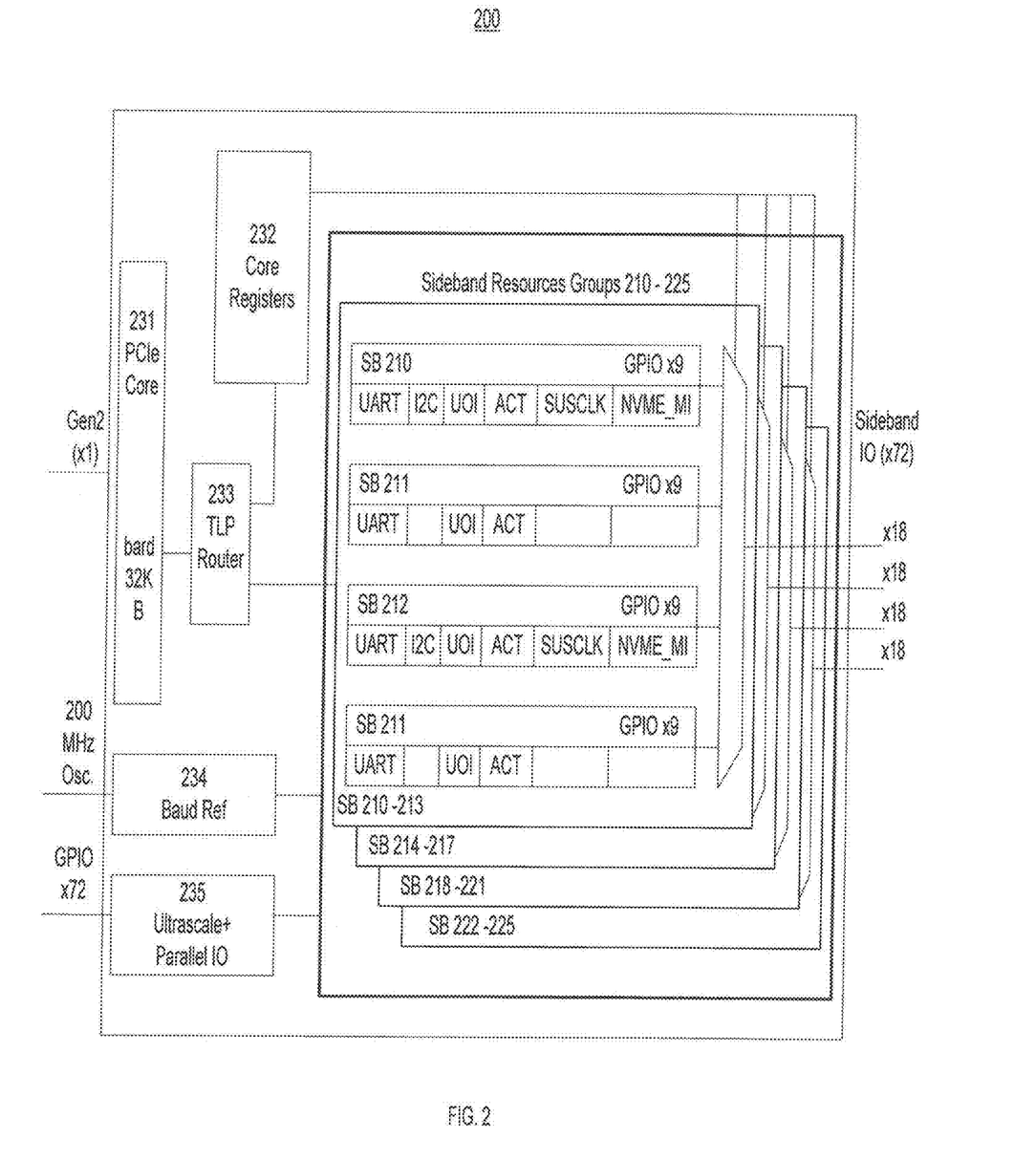
FIG. 2 is a block diagram of an exemplary sideband resource grouping in accordance with one embodiment.

The flexible sideband support systems and methods can also include a flexible way of assigning sideband resources to specific DUTs. In one exemplary implementation, multiple resources can be assigned to a specific DUT. FIG. 2 is a block diagram of an exemplary flexible sideband support system 200 in accordance with one embodiment. Flexible sideband support system 200 supports flexible grouping of resources. Flexible sideband support system 200 includes sideband resource groups 210 through 225, peripheral component interface express (PCIe) Core 331, core registers 332, Translation Layer Protocol (TLP) router 333, baud reference component 334, and a general purpose input/output (GPIO) 335. Sideband resource groups 210 through 225 can be arranged or configure in sets 251, 252, 253, and 254. Set 251 includes sideband resource group 210-213. Set 252 includes sideband resource group 214-217. Set 253 includes sideband resource group 218-221. Set 254 includes sideband resource group 222-225. The components cooperatively operate to provide flexible grouping of resources.

PCIe Core 231 is configured to handle PCI protocol communication packets. Core registers 232 are configured to store resource hardware configuration information. In one embodiment, flexible sideband support system 200 is implemented in a FPGA and the core registers 232 include information on configuration of logic blocks in a hardware core implementation in the FPGA. In one exemplary implementation, the core registers 232 include firmware information associated with hardware configuration. TLP router 233 is configured to route information to the resources and the core registers. Baud reference component 234 is configured to receive an external clock signal and provide internal engine clock signals. General purpose input/output (GPIO) 235 is configured to transmit and receive signals.

It is appreciated that a resource group can include various resources. In one embodiment, sideband resource groups 210-213 in set 251 include various communication protocol resources. Sideband resource group 210 includes a UART resource, an I2C resource, a UOI resource, an ACT resource, a SUSCLK resource, and a NVME_MI resource. Sideband resource group 211 includes a UART resource, an UOI resource, and an ACT resource. Sideband resource group 212 includes a UART resource, an I2C resource, a UOI resource, an ACT resource, a SUSCLK resource, and a NVME_MI resource. Sideband resource group 213 includes a UART resource, an UOI resource, and an ACT resource. A set can also include a switching component to switch and selectively couple one of the sideband resource groups to a DUT. In one exemplary implementation, set 251 includes a switching component 271 (e.g., a multiplexer (MUX), a crossbar switch, etc.) to switch and selectively couple one of the DUTs.

The ability to assign multiple resources to a specific DUT lends itself to more efficient use of resources in the FPGA because idle resources can be reassigned to active DUTs. As some of the DUTs complete their testing, the resources assigned to the completed DUTs can be reassigned to DUTs that are still running. In one embodiment, the control can be directed (e.g., by software, etc.) which enables the application of resources to where they are most valuable and frees up some of the FPGA logic that had previously been dedicated to handling/managing the association of resources to DUTs. The freed-up FPGA logic can be used for other functions.

Figure 3:
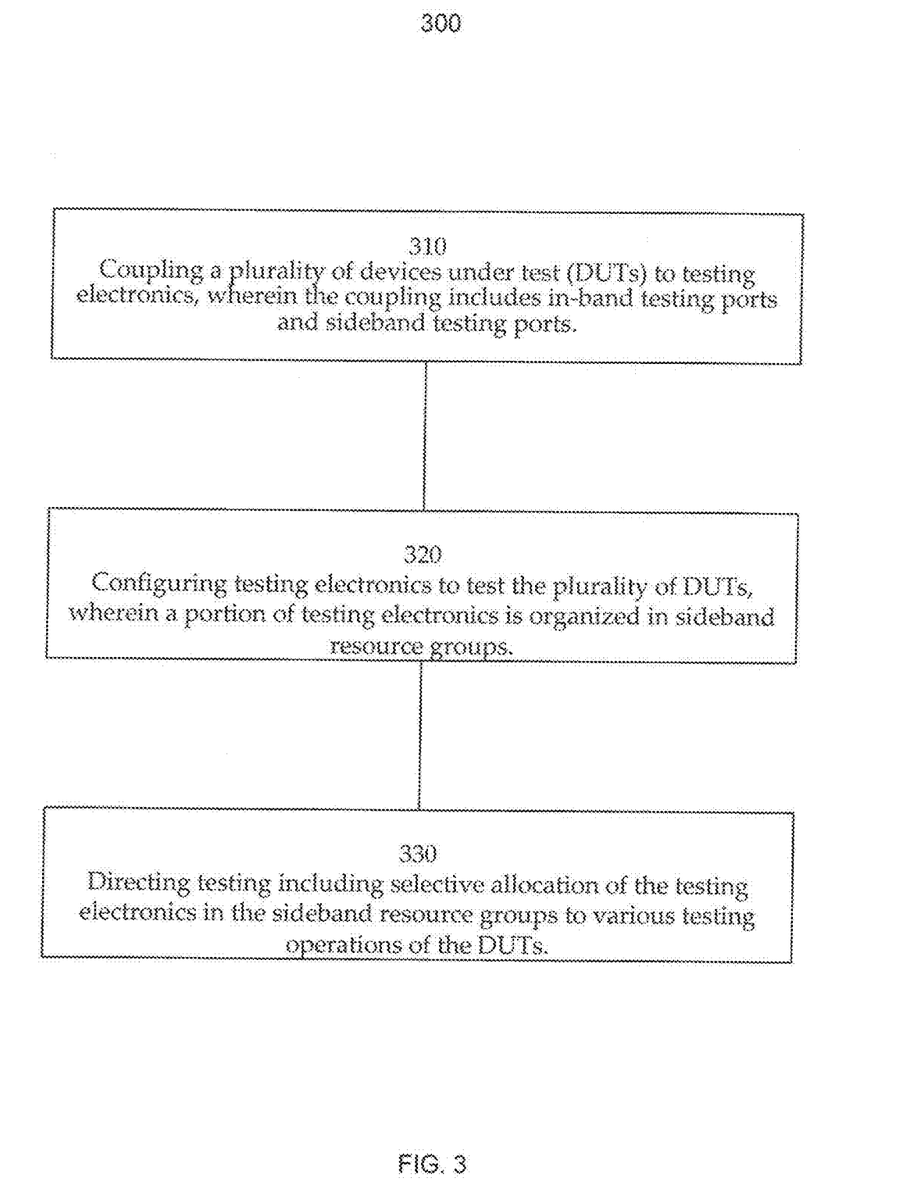
FIG. 3 is a flow chart of an exemplary sideband resource grouping method in accordance with one embodiment.

FIG. 3 is a flow chart of an exemplary sideband resource grouping method 300 in accordance with one embodiment.

In block 310, a plurality of devices under test (DUTs) are coupled to testing electronics, wherein the coupling includes in-band testing ports and sideband testing ports.

In block 320, testing electronics are configured to test the plurality of DUT. In one embodiment, a portion of testing electronics is organized in sideband resource groups.

In block 330, testing is directed. In one embodiment, the direction includes selective allocation of the testing electronics in the sideband resource groups to various testing operations of the DUTs, wherein the directing includes directing a portion of sideband testing of a plurality of DUTs concurrently. In one exemplary implementation, multiple resources are assigned to a specific one of the plurality of DUTs.

Figure 4:
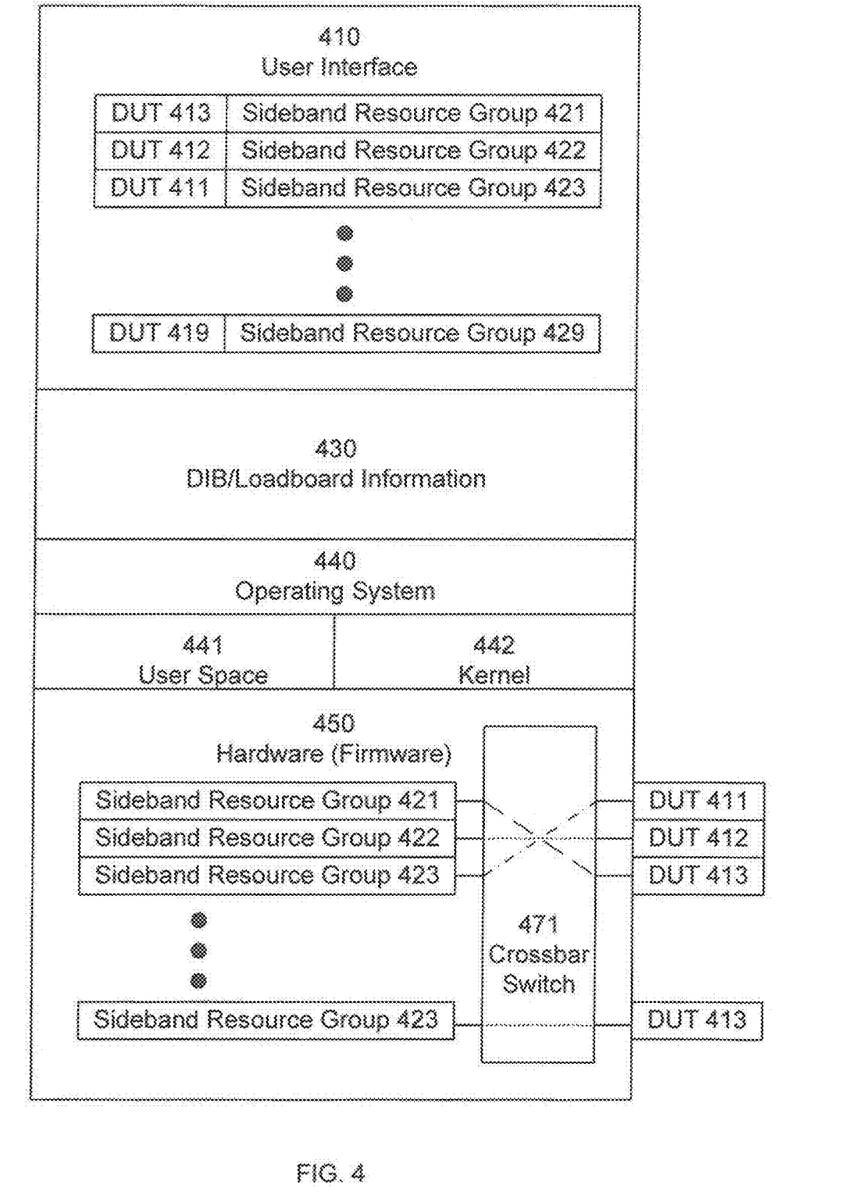
FIG. 4 is a block diagram of an exemplary tester equipment configuration control system hierarchy in accordance with one embodiment.

In one embodiment, test equipment includes a tester equipment configuration control system for directing test equipment configuration. In one exemplary implementation, the equipment configuration control system is configured in a hierarchy. FIG. 4 is a block diagram of an exemplary tester equipment configuration control system hierarchy 400 in accordance with one embodiment. Tester equipment configuration control system hierarchy includes a user interface layer 410, a device interface board/loadboard information layer 430, an operating system layer 440, and a hardware/firmware layer 450.

User interface layer 410 includes a user interface to convey information to/from a user. User interface layer 410 can convey information associated with flexible sideband resource group assignment to DUTs. In one embodiment, user interface layer 410 includes a graphical user interface (GUI). The user interface can display information associated with current assignments of flexible sideband resources to respective DUTs. In one exemplary implementation, a GUI includes a display indicting an association/assignment of sideband resourced groups (e.g., 421, 422, 423, 429, etc.) to respective DUTs (e.g., 411, 412, 413, 419, etc.).

Device interface board/loadboard information layer 430 tracks information regarding assignment or mapping of flexible sideband resources to respective DUTs.

Operating system layer 440 can control communication of information regarding assignment or mapping of flexible sideband resources to respective DUTs in hardware/firmware layer 450. Operating system layer 440 can include two paths for communicating the information comprising a user space path 441 and a kernel/driver path 442. In one embodiment operating system layer 440 is based upon a LINUX operating system.

Hardware/firmware layer 450 includes flexible sideband resources. In one exemplary implementation, hardware/firmware layer 450 includes a flexible sideband support system. The flexible sideband support system can be similar to flexible sideband support system 200. In one exemplary implementation, hardware/firmware layer 450 assigns sideband resourced groups (e.g., 421, 422, 423, 429, etc.) to respective DUTs (e.g., 411, 412, 413, 419, etc.) via a switching component (e.g., crossbar switch 471, MUX, etc.).

In one embodiment, control components manage assignment of the sideband resource groups to the DUTs. In one exemplary implementation, assignment of the sideband resource groups to the DUTs is managed and controlled in the user interface layer 410, a device interface board/loadboard information layer 430, and an operating system layer 440, while assignment of the sideband resource groups to the DUTs is implemented in the hardware/firmware layer 450. A user can direct assignment of the sideband resource groups to the DUTs via the user interface layer 410. Assignment of the sideband resource groups to the DUTs can be communicated to and from a remote source (e.g., central location, a network, the cloud, etc.). In one embodiment, handling management and control in layers other than the hardware/firmware layer 450 can free up hardware logic components/unit resources in hardware/firmware layer 450 from management/control activities and make them available for other configurations (e.g., as part of crossbar switch functionalities, other testing functionality, other sideband activities, etc.).

In one embodiment, a flexible sideband support system can automatically assign the sideband resource groups to the DUTs. A flexible sideband support system can include artificial intelligence to assist in making decisions regarding assignment of the sideband resource groups to the DUTs. In one exemplary implementation, a flexible sideband support system receives information regarding the characteristics and features of a DUT and makes an assignment of the sideband resource groups to the DUTs accordingly. If a DUT has a UART sideband communication port the flexible sideband support system can automatically analyze the information and assign a sideband resource group with a UART capability to the DUT. A flexible sideband support system can actively update and change assignment of the sideband resource groups to the DUTs. In one exemplary implementation, as a sideband resource group becomes available (e.g., finishes operations with another DUT, becomes idle, etc.) a flexible sideband support system an automatically reassign them (e.g., to another DUT, etc.).

In one embodiment, a flexible sideband support system can consider/analyze various sideband activities that testing of a particular DUT may involve, and incorporate the analysis results in management and control decisions directed at assignment of sideband resource groups. In one exemplary implementation, a flexible sideband support system can adjust sideband activities and assignment of sideband resource groups to facilitate efficient and effective testing. A flexible sideband support system can consider/weigh if the time and effort of reassigning sideband resources is appropriate/worth it for particular given sideband test activities. If a sideband resource group assigned to and working with a first DUT becomes temporarily idle (but will be needed by the first DUT again), a flexible sideband support system can analyze if the sideband resources can be assigned to second DUT and complete activities on the second DUT before a time at which the sideband resources are required to be returned to the first DUT.

In one embodiment, flexible sideband support systems and methods include association/assignment of sideband resources to DUTs. In one exemplary implementation, a flexible sideband support system can participate in sideband activities on a large number of devices substantially in parallel/simultaneously. A flexible sideband support system can assign a group including multiple resources to a DUT, unlike a typical traditional system with a fixed relationship in which there was one sideband resource assigned per DUT. A flexible sideband support system can also provide flexibility as to what resources are included in the group assigned to the DUT. In one embodiment, flexible sideband support systems and methods include mapping a DUT to multiple resources which can be flexibly changed, overcoming limitations associated with a conventional one to one mapping of a resource and a DUT.

Figure 5:
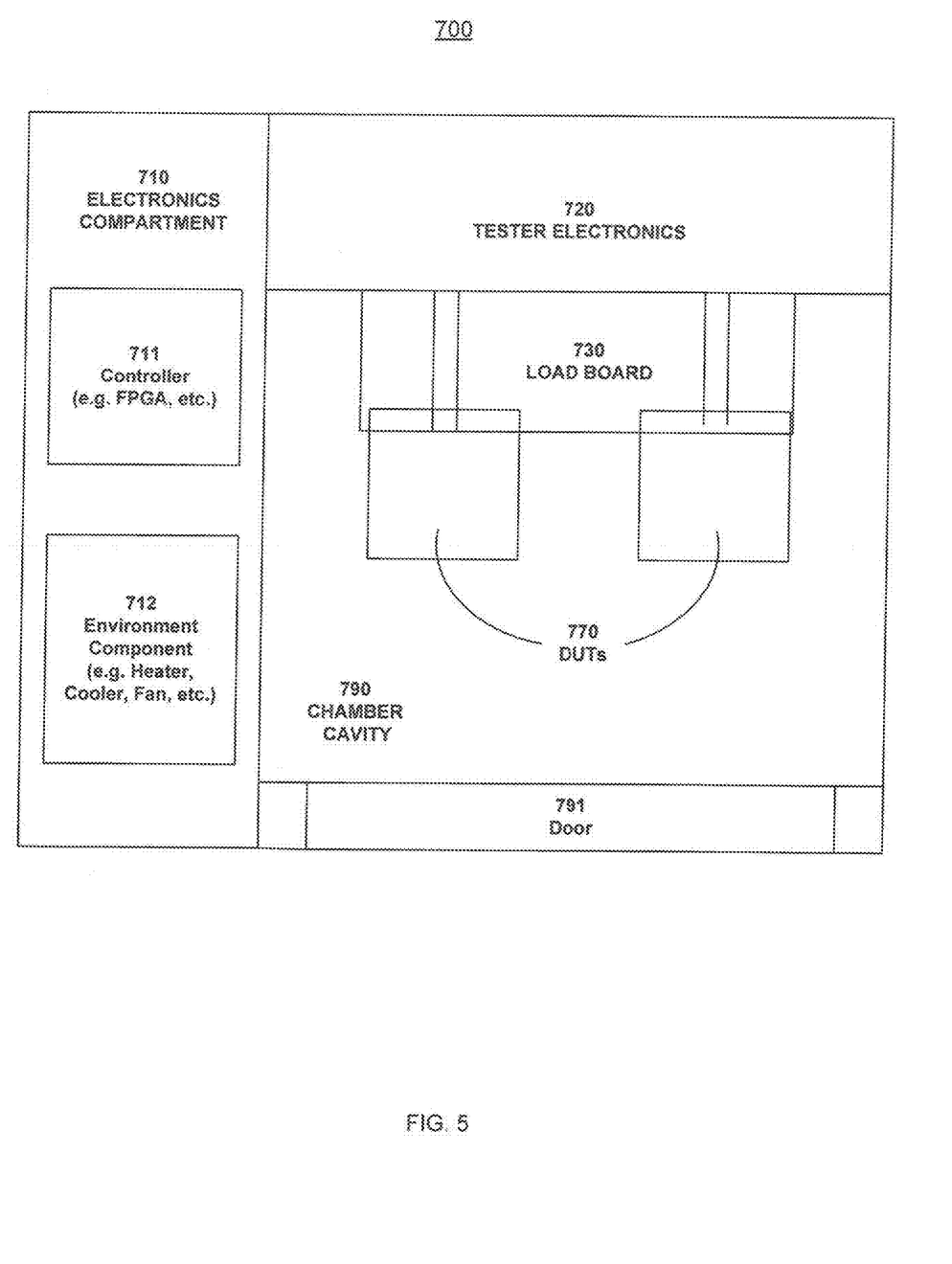
FIG. 5 is a block diagram of an exemplary testing system in accordance with one embodiment.
Figure 6:
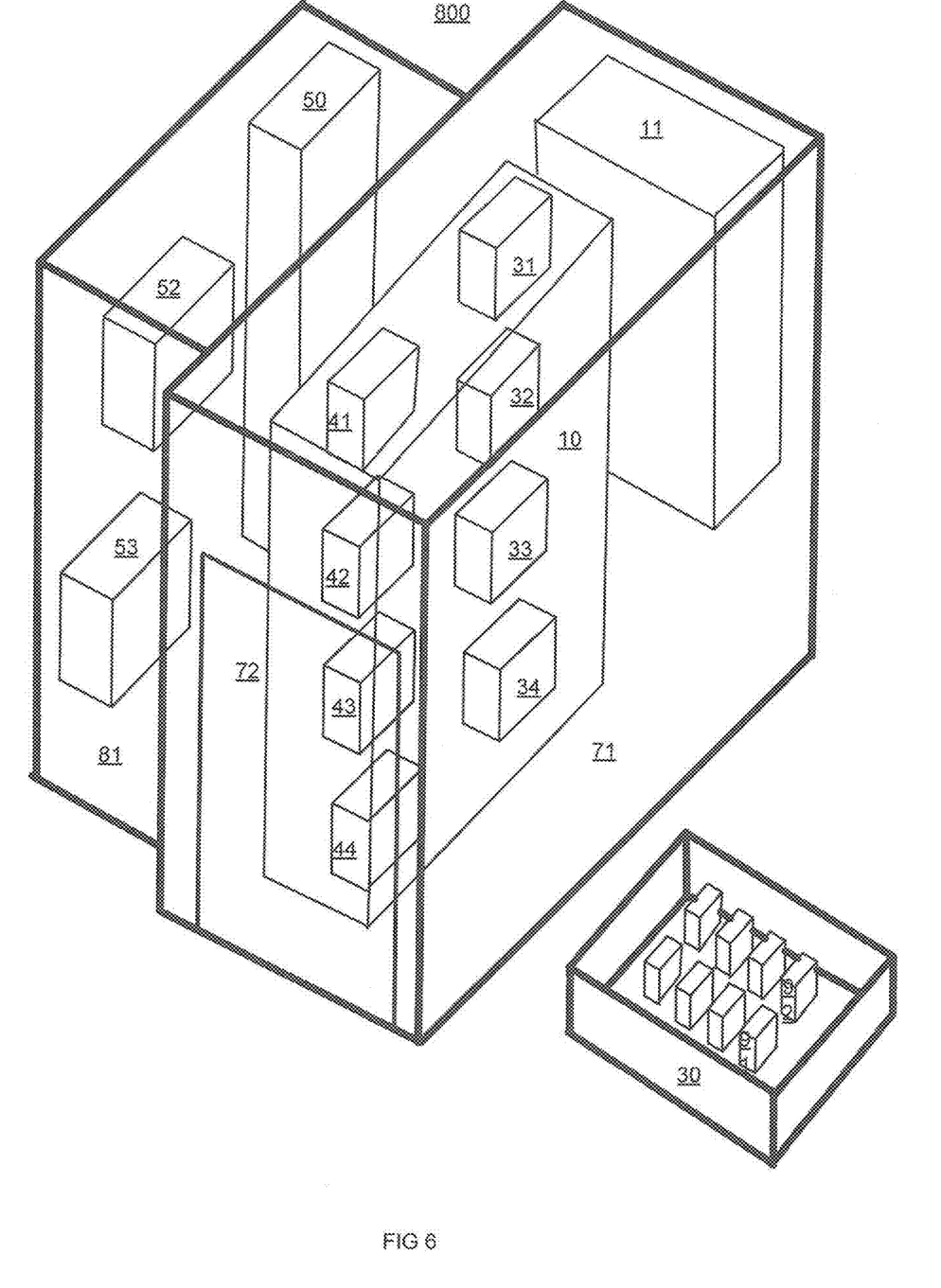
FIG. 6 is a block diagram of an exemplary testing system in accordance with one embodiment.
Figure 7:
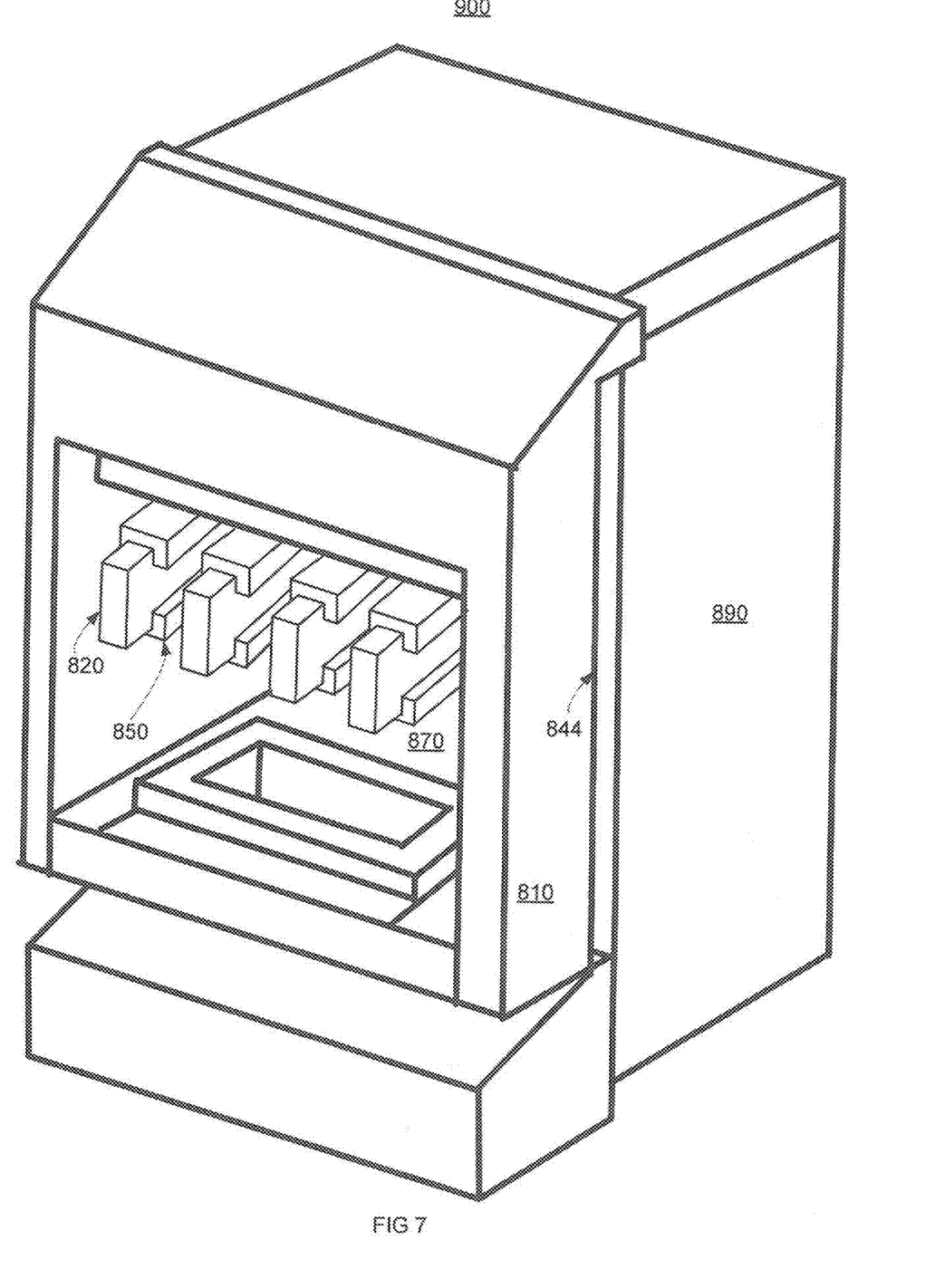
FIG. 7 is a block diagram of an exemplary test system in accordance with one embodiment.

In one embodiment, enhanced auxiliary interface test systems and methods can be implemented in test systems similar to the embodiments shown in the FIGS. 5, 6, and 7. In one embodiment, systems in FIGS. 5, 6, and 7 can implement flexible sideband resource group configurations similar to systems 100, 200 and 400.

FIG. 5 is a block diagram of an exemplary testing system 500 in accordance with one embodiment. Testing system 500 includes electronics compartment 510, tester electronics 520, loadboard 530, DUTs 570, and testing chamber 590 with door 591. Electronics compartment 510 includes controller 511 and environment compartment 512.

It is appreciated that selectable testing systems and methods can be implemented in various testing system configurations or approaches. FIG. 6 is a block diagram of an exemplary testing system in accordance with one embodiment. It consists of a large controlled environmental chamber or oven 71 that contains an oven rack 10 and heating and cooling elements 11. The oven rack 10 contains devices under test (DUTs) in a number of loadboard trays 31, 32, 33, 34, 41, 42, 43, and 44. The environmental test chamber 71 has solid walls and a solid door 72 that enclose the test rack 10. The heating and cooling elements 11 can have a wide temperature range (e.g., −10 to 120 degrees C.). The tester or test head 81 contains various racked components, including system controller network switches 52, system power supply components 53, and tester slices (the tester slice contains the tester electronics). The loadboard trays (e.g., 30, 31, etc.) are connected to tester slices 50 (multiple loadboard trays can be coupled to a single tester slice). There is also a block diagram of a tester tray 30 and devices under test (e.g., 91, 92, etc.). The loadboard trays are manually populated with devices under test. The full tester trays (e.g., 30, 31, etc.) are manually inserted into environmental chamber 71 and manually connected to the tester electronics (e.g., 50, 52, 53, etc.). This process can be labor intensive and cumbersome (e.g., the process requires opening the door 72 of the environmental chamber 71 and manually trying to insert the trays though the door 72 into the appropriate location).

In one embodiment, a test system includes a device interface board and tester electronics that control testing operations. The tester electronics can be located in an enclosure which together are referred to as the primitive. The device interface board has a device under test access interface that allows physical manipulation of the devices under test (e.g., manual manipulation, robotic manipulation, etc.). A device under test can be independently manipulated physically with little or no interference or impacts on testing operations of another device under test. Device interface boards and their loadboards can be conveniently setup to accommodate different device form factors. In one embodiment, loadboards are configured with device under test interfaces and universal primitive interfaces. In one exemplary implementation, the device interface board can control an ambient environment of a device under test.

FIG. 7 is a block diagram of an exemplary test system 800 in accordance with one embodiment. Test system 800 includes a testing primitive 890 (e.g., containing the testing control hardware and power supply components for the devices under test, etc.) and a device interface board (DIB) 810 disposed in front of and coupled to the primitive 890. In one embodiment, the device interface board 810 is a partial enclosure. The loadboard is also coupled to and electrically interfaces with the primitive 890 to obtain power and high-speed electrical signals for testing the device under test 820. The device interface board can include air flow channels 844 that allow air flow to and from the device under test environment. The air flow channels 844 can include baffles. The device interface board 810 partial enclosure includes a device under test access interface 870 that enables easy physical access (e.g., unobstructed, unimpeded, etc.) to the devices under test. Environmental control components 811 and 814 control and maintain device under test ambient environmental conditions (e.g., temperature, air flow rate, etc.). The environmental control components can create an environmental envelope that prevents or mitigate interference from outside environmental conditions on the operations of devices under test. Access to test system 800 may be easier than test system 700.

While the invention has been described in conjunction with the preferred embodiments, it will be understood that they are not intended to limit the invention to these embodiments. On the contrary, the invention is intended to cover alternatives, modifications, and equivalents. The description is not intended to be exhaustive or to limit the invention to the precise forms disclosed, and obviously many modifications and variations are possible.

Thus, flexible sideband support systems and methods can allow more devices to be tested in parallel (e.g., parallel sideband testing, etc.). Flexible sideband support systems and methods can provide greater flexibility: 1) for dealing with different sideband protocols, and 2) in assigning multiple resources to a DUT.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the discussions, it is appreciated that throughout the present application, discussions utilizing terms such as "processing", "computing", "calculating", "determining", "displaying" or the like, refer to the action and processes of a computer system, or similar processing device (e.g., an electrical, optical, or quantum, computing device), that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

It is appreciated that embodiments of the present invention can be compatible and implemented with a variety of different types of tangible memory or storage (e.g., RAM, DRAM, flash, hard drive, CD, DVD, etc.). The memory or storage, while able to be changed or rewritten, can be considered a non-transitory storage medium. By indicating a non-transitory storage medium it is not intended to limit characteristics of the medium, and can include a variety of storage mediums (e.g., programmable, erasable, nonprogrammable, read/write, read only, etc.) and "non-transitory" computer-readable media comprises all computer-readable media, with the sole exception being a transitory, propagating signal.

It is appreciated that the description includes exemplary concepts or embodiments associated with the novel approach. It is also appreciated that the listing is not exhaustive and does not necessarily include all possible implementation. The concepts and embodiments can be implemented in hardware, firmware, software, and so on. In one embodiment, the methods or process describe operations performed by various processing components or units. In one exemplary implementation, instructions, or directions associated with the methods, processes, operations etc. can be stored in a memory and cause a processor to implement the operations, functions, actions, etc.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A flexible sideband support method comprising:
   managing flexible assignment of sideband test resources to a plurality of devices under test (DUTs), wherein the sideband test resources are assigned according to characteristics and features of the plurality of DUTs, wherein the managing comprises analyzing whether reassigning the sideband test resources is appropriate;
   coupling a first DUT in the plurality of DUTs to a first portion of the sideband test resources based upon the flexible assignment of the sideband test resources to the plurality of DUTs; and
   testing the first DUT, wherein the testing of the first DUT comprises sideband testing utilizing the first portion of the sideband test resources, wherein the analyzing comprises detecting an idle condition in the sideband testing of the first DUT and analyzing whether the idle condition is associated with a pause time sufficient to reassign the first portion of the sideband test resources from the first DUT to a second DUT in the plurality of DUTs.

2. The flexible sideband support method of claim 1, further comprising:
   coupling the second DUT in the plurality of DUTs to a second portion of the sideband test resources based upon the flexible assignment of the sideband test resources to the plurality of DUTs; and
   testing the second DUT, wherein the testing the second DUT comprises sideband testing utilizing the second portion of the sideband test resource.

3. The flexible sideband support method of claim 2, wherein the second DUT is coupled to the second portion of the sideband test resources when the analyzing indicates the pause time is not sufficient to reassign the first portion of the sideband test resources from the first DUT to the second DUT.

4. The flexible sideband support method of claim 1, wherein the pause time is sufficient for testing activities to be completed on the second DUT before the idle condition associated with the first DUT is over.

5. The flexible sideband support method of claim 1, wherein the first portion of the sideband test resources are decoupled from the first DUT and coupled to the second DUT when the analyzing indicates the pause time is sufficient to reassign the first portion of the sideband test resources from the first DUT to the second DUT.

6. The flexible sideband support method of claim 5, wherein the first portion of the sideband test resources are decoupled from the second DUT and recoupled to the first DUT.

7. The flexible sideband support method of claim 1, further comprising configuring sideband test resources in a plurality of groups.

8. The flexible sideband support method of claim 1, wherein the sideband testing of the first DUT and in band testing of the first DUT is performed concurrently.

9. The flexible sideband support method of claim 1, wherein the managing testing comprises directing a portion of the sideband testing of the first DUT in parallel with testing of the second DUT.

10. The flexible sideband support method of claim 1, wherein the sideband test resources are flexibly reassigned to a second DUT when sideband testing of the first DUT is complete.

11. A flexible sideband support system comprising:
    a load board configured with test ports that couple with a first device under test (DUT), wherein the test ports comprise sideband test ports;
    sideband testing resources configured to test the first DUT, wherein the sideband testing resources are coupled to the load board; and
    a controller configured to direct testing of the first DUT, wherein the testing comprises sideband testing and the controller directs variable assignment of the sideband testing resources to the first DUT, wherein the assigning comprises analyzing reassignment of the sideband test resources when an idle condition in the sideband testing of the first DUT is detected and whether the idle condition is associated with a pause time sufficient to reassign the sideband test resources from the first DUT.

12. The flexible sideband support system of claim 11, wherein a first portion of the sideband testing resources comprise a first group of testing capabilities and a second portion of the sideband testing resources comprises a second group of testing capabilities.

13. The flexible sideband support system of claim 11, wherein a first portion of the sideband testing resources are assigned and coupled to the first DUT and a second portion of the sideband testing resources are assigned to a second DUT.

14. The flexible sideband support system of claim 11, wherein a first portion of the sideband testing resources are reassigned from the first DUT to a second DUT.

15. The flexible sideband support system of claim 11, wherein the sideband testing is performed concurrently with in-band testing.

16. The flexible sideband support system of claim 11, wherein results of the variable assignment of the sideband testing resources to the first DUT is communicated to a remote resource.

17. The flexible sideband support system of claim 11, wherein the coupling of sideband testing resources is via a crossbar switch.

18. The flexible sideband support system of claim 11, wherein Artificial Intelligence (AI) assists in making decisions regarding the variable assignment of the sideband testing resources.

19. The flexible sideband support system of claim 11, wherein the first DUT is mapped to multiple sideband testing resources.

* * * * *